US006611434B1

(12) United States Patent
Lo et al.

(10) Patent No.: US 6,611,434 B1
(45) Date of Patent: Aug. 26, 2003

(54) STACKED MULTI-CHIP PACKAGE STRUCTURE WITH ON-CHIP INTEGRATION OF PASSIVE COMPONENT

(75) Inventors: Randy H. Y. Lo, Taipei (TW); Tzong-Da Ho, Taichung (TW); Chi-Chuan Wu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/699,847

(22) Filed: Oct. 30, 2000

(51) Int. Cl.⁷ .................................................. H05K 7/02
(52) U.S. Cl. .................. 361/760; 361/760; 361/764; 361/790; 361/730; 257/924; 257/723; 257/724
(58) Field of Search ................................ 361/760, 764, 361/790, 811, 718, 735, 748, 734, 766, 730; 438/238, 239; 174/259, 260, 117, 110 E; 257/723, 724, 924

(56) References Cited

U.S. PATENT DOCUMENTS

| | | | |
|---|---|---|---|
| 4,447,857 A | * 5/1984 | Marks et al. ................ 361/739 |
| 5,200,810 A | * 4/1993 | Wojnarowski et al. ...... 361/750 |
| 5,633,785 A | 5/1997 | Parker et al. |
| 5,694,297 A | * 12/1997 | Smith et al. ................ 361/785 |
| 5,696,031 A | * 12/1997 | Wark ............................. 438/4 |
| 5,905,639 A | * 5/1999 | Warren ......................... 361/776 |
| 6,258,626 B1 | * 7/2001 | Wang et al. ................. 438/107 |
| 6,307,256 B1 | * 10/2001 | Chiang et al. ............... 257/668 |
| 6,313,998 B1 | * 11/2001 | Kledzik et al. ............... 361/767 |
| 6,320,757 B1 | * 11/2001 | Liu .............................. 361/760 |
| 6,330,164 B1 | * 12/2001 | Khandros et al. ........... 361/760 |

* cited by examiner

Primary Examiner—David Martin
Assistant Examiner—Hung Bui
(74) Attorney, Agent, or Firm—Peter F. Corless; Steven M. Jensen; Edwards & Angell, LLP

(57) ABSTRACT

A stacked multi-chip package structure with on-chip integration of passive component is proposed, which is characterized in the mounting of passive component on a remaining surface area of the underlying semiconductor chip that is unoccupied by the overlying semiconductor chip, so that the overall package construction can be made more compact in size. The proposed package structure comprises: a substrate; a first semiconductor chip mounted over the substrate; a second semiconductor chip mounted over the first semiconductor chip; and at least one passive component mounted beside the second semiconductor chip and over the first semiconductor chip. The first and second semiconductor chips can be mounted by means of adhesive layers or flip chip technology. The passive component can be electrically coupled to the semiconductor chips through the use of wire-bonding technology (WBT) or surface-mount technology (SMT).

8 Claims, 2 Drawing Sheets

STACKED MULTI-CHIP PACKAGE STRUCTURE WITH ON-CHIP INTEGRATION OF PASSIVE COMPONENT

BACKGROUND OF THE INVENTION

1. Field of the Invention

This invention relates to integrated circuit packaging technology, and more particularly, to a stacked multi-chip package structure with on-chip integration of passive component that allows the overall package construction to be made more compact in size.

2. Description of Related Art

Multi-chip packaging technology is used to pack two or more semiconductor chips in one single package module, so that one single package module is capable of offering a manifold level of functionality or data storage capacity. Memory chips, such as flash memory chips, are typically packaged in this way so as to allow one single memory module to offer an increased level of data storage capacity.

In some applications, such as high-frequency semiconductor devices, it is often required to integrate passive components, such as resistors, inductors, and capacitors, with the packaged semiconductor chips so as to make the integrated circuitry meet specific electrical requirements. Conventionally, these passive components are mounted on a remaining area of the substrate that is unoccupied by the packaged semiconductor chips. This layout scheme, however, would make the overall package construction considerably large in size.

Related patents, include, for example, the U.S. Pat. No. 5,633,785 entitled "INTEGRATED CIRCUIT COMPONENT PACKAGE WITH INTEGRAL PASSIVE COMPONENT". This patent teaches the use of an interconnect substrate that is integrally formed with passive components therein. This passive component integration scheme, however, has the following drawbacks. First, it requires an extra substrate area/for accommodating the passive components, which would make the overall package construction considerably large in size. Second, it would make the substrate more complex in structure, making the overall packaging process more laborious and costly to implement.

SUMMARY OF THE INVENTION

It is therefore an objective of this invention to provide a stacked multi-chip package structure, which can integrate passive components in the package without having to use an extra substrate area so that the overall package construction can be made more compact in size than prior art.

It is another objective of this invention to provide a stacked multi-chip package structure, which can use off-the-shelf passive components for integration with the packaged semiconductor chips, while nonetheless allowing the overall package construction to be made more compact in size than prior art.

In accordance with the foregoing and other objectives, the invention proposes a stacked multi-chip package structure with on-chip integration of passive component.

Broadly recited; the stacked multi-chip package structure of the invention comprises (a) a substrate; (b) a first semiconductor chip mounted over the substrate; (c) a second semiconductor chip mounted over the first semiconductor chip; the second semiconductor chip being smaller in size than the first semiconductor chip; and (d) at least one passive component mounted beside the second semiconductor chip and over the first semiconductor chip.

In the foregoing stacked multi-chip package structure, the first semiconductor chip and the second semiconductor chip can be mounted by means of adhesive layers or flip-chip technology. The passive component can be electrically coupled to the semiconductor chips through the use of wire-bonding technology (WBT) or surface-mount technology (SMT).

Since the passive component is mounted on a remaining surface area of the first semiconductor chip that is unoccupied by the second semiconductor chip, rather than over the substrate, it allows the overall package construction to be made more compact in size than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The stacked multi-chip package structure with on-chip integration of passive component according to the invention is disclosed in full details by way of several preferred embodiments in the following with reference to FIGS. 1A–1B, FIG. 2, FIG. 3, and FIG. 4, respectively.

Figure 1A:
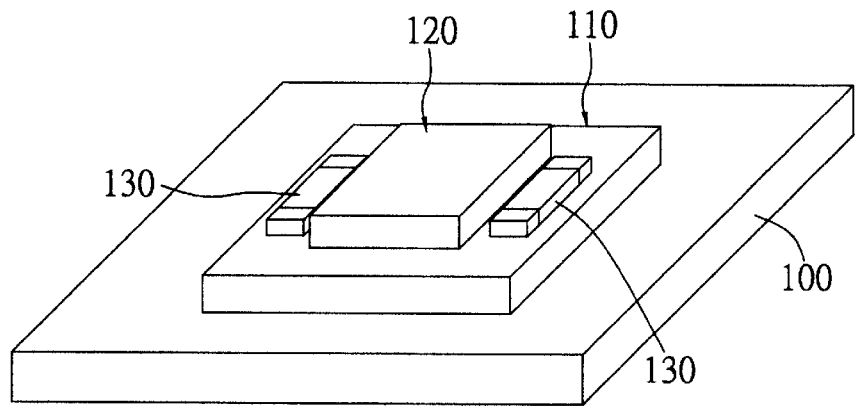
FIG. 1A shows a schematic perspective view of a first preferred embodiment of the stacked multi-chip package structure of the invention.
Figure 1B:
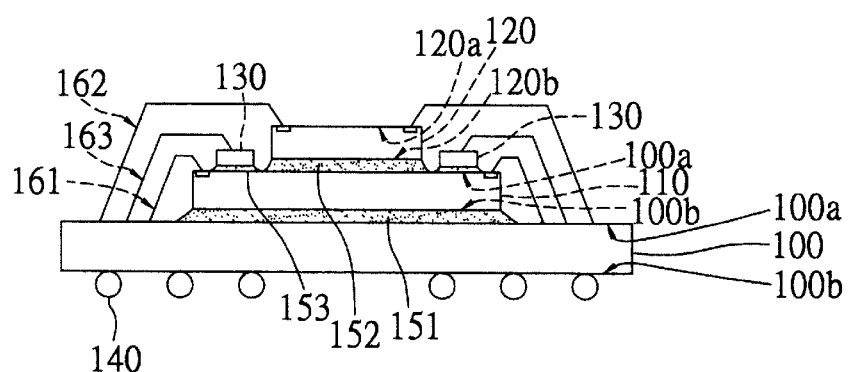
FIG. 1B shows a schematic sectional view of the stacked multi-chip package structure of FIG. 1A.

First Preferred Embodiment (FIGS. 1A–1B)

The first preferred embodiment of the stacked multi-chip package structure of the invention is disclosed in full details in the following with reference to FIGS. 1A–1B.

Referring to FIG. 1A, the stacked multi-chip package structure of the invention comprises a substrate 100, a first semiconductor chip 110, a second semiconductor chip 120, and two passive components 130 (note that in FIG. 1A, bonding pads and wires are not shown).

Referring to FIG. 1B together with FIG. 1A, the substrate 100 has a front side 100a and a back side 100b, wherein the front side 100a is used for chip mounting, and the back side 100b is used for the mounting of a grid array of solder balls 140.

The first semiconductor chip 110 has a circuit surface 110a (or called active surface, which is the surface where active circuit components and bond pads are fabricated) and a noncircuit surface 110b (or called inactive surface, which is the surface where no active circuit components and bond pads are fabricated), wherein the noncircuit surface 110b is attached to the front side 100a of the substrate 100 by means of a first adhesive layer 151, such as silver paste. Further, the first semiconductor chip 110 is electrically coupled to the substrate 100 by means of a first set of bonding wires 161.

In accordance with the invention, it is to be noted that the second semiconductor chip 120 should be smaller in size than the first semiconductor chip 110, so that the second semiconductor chip 120 and the passive components 130 can be both mounted over the first semiconductor chip 110. The second semiconductor chip 120 has a circuit surface 120a and a noncircuit surface 120b, wherein the noncircuit surface 120b is attached to the circuit surface 110a of the first semiconductor chip 110 by means of a second adhesive layer 152, such as silver paste. Further, the second semiconductor chip 120 is electrically coupled to the substrate 100 by means of a second set of bonding wires 162.

It is a characteristic feature of the invention that the passive components 130 are mounted on a remaining surface area of the first semiconductor chip 110 that is unoccupied by the second semiconductor chip 120. In this embodiment, the passive components 130 are each adhered to the circuit surface 110a of the first semiconductor chip 110 by means of a third adhesive layer 153 and electrically coupled to the substrate 100 through the use of wire-bonding technology (WBT) by means of a third set of bonding wires 163, which includes a pair of bonding wires respectively bonded to the two ends of each of the passive components 136.

Subsequent processes to finish the stacked multi-chip package structure are all conventional techniques which are not within the spirit and scope of the invention, so description thereof will not be further detailed.

Since the passive components 130 are mounted on a remaining surface area of the first semiconductor chip 110 that is unoccupied by the second semiconductor chip 120, rather than over the substrate 100, it allows the overall package construction to be made more compact in size than prior art.

Figure 2:
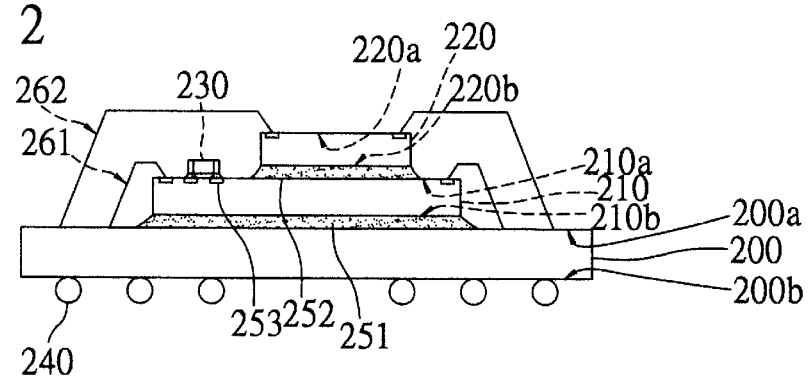
FIG. 2 shows a schematic sectional view of a second preferred embodiment of the stacked multi-chip package structure of the invention.

Second Preferred Embodiment (FIG. 2)

The second preferred embodiment of the stacked multi-chip package structure of the invention is disclosed in full details in the following with reference to FIG. 2.

As shown, the stacked multi-chip package structure of the second preferred embodiment comprises a substrate 200, a first semiconductor chip 210, a second semiconductor chip 220, and a passive component 230.

The substrate 200 has a front side 200a and a back side 200b, wherein the front side 200a is used for chip mounting, and the back side 200b is used for the mounting of a grid array of solder balls 240.

The first semiconductor chip 210 has a circuit surface 210a and a noncircuit surface 210b, wherein the noncircuit surface 210b is attached to the front side 200a of the substrate 200 by means of a first adhesive layer 251, such as silver paste. Further, the first semiconductor chip 210 is electrically coupled to the substrate 200 by means of a first set of bonding wires 261.

The second semiconductor chip 220 is smaller in size than the first semiconductor chip 210, and has a circuit surface 220a and a noncircuit surface 220b, wherein the noncircuit surface 220b is attached to the circuit surface 210a of the first semiconductor chip 210 by means of a second adhesive layer 252, such as silver paste. Further, the second semiconductor chip 220 is electrically coupled to the substrate 200 by means of a second set of bonding wires 262.

It is a characteristic feature of the invention that the passive components 230 are mounted on a remaining surface area of the first semiconductor chip 210 that is unoccupied by the second semiconductor chip 220. This embodiment differs from the previous one particularly in that the passive component 230 is directly soldered to a pair of bond pads 253 on the first semiconductor chip 210 through the use of surface-mount technology (SMT) so as to be electrically coupled to the first semiconductor chip 210.

Since the passive component 230 is mounted on a remaining surface area of the first semiconductor chip 210 that is unoccupied by the second semiconductor chip 220, rather than over the substrate 200, it allows the overall package construction to be made more compact in size than prior art.

Figure 3:
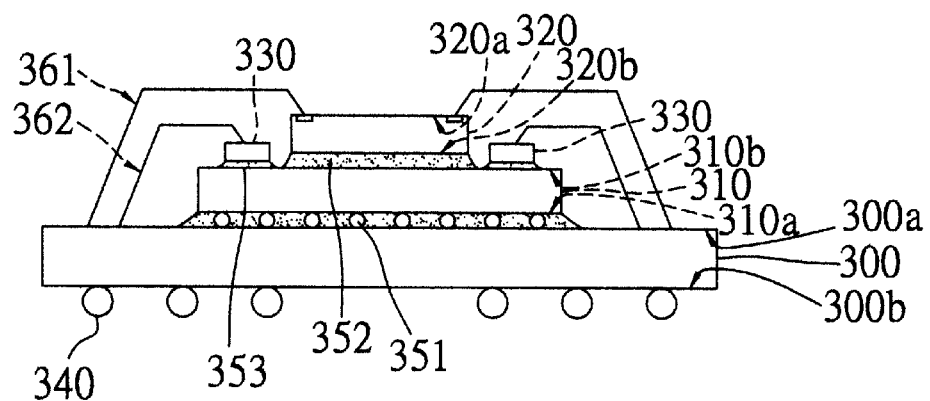
FIG. 3 shows a schematic sectional view of a third preferred embodiment of the stacked multi-chip package structure of the invention.

Third Preferred Embodiment (FIG. 3)

The third preferred embodiment of the stacked multi-chip package structure of the invention is disclosed in full details in the following with reference to FIG. 3.

As shown, the stacked multi-chip package structure of this embodiment comprises a substrate 300, a first semiconductor chip 310, a second semiconductor chip 320, land two passive components 330.

The substrate 300 has a front side 300a and a back side 300b, wherein the front side 300a is used for chip mounting, and the back side 300b is used for the mounting of a grid array of solder balls 340.

The first semiconductor chip 310 has a circuit surface, 310a and a noncircuit surface 310b, wherein the circuit surface 310a is coupled to the front side 300a of the substrate 300 through the use of flip-chip technology by means of an array of solder bumps 351.

The second semiconductor chip 320 is smaller in size than the first semiconductor chip 310, and has a circuit surface 320a and a noncircuit surface 320b, wherein the noncircuit surface 320b is attached to the noncircuit surface 310b of the first semiconductor chip 310 by means of a first adhesive layer 352, such as silver paste. Further, the second semiconductor chip 320 is electrically coupled to the substrate 300 by means of a first set of bonding wires 361.

It is a characteristic feature of the invention that the passive components 330 are mounted on a remaining surface area of the first semiconductor chip 310 that is unoccupied by the second semiconductor chip 320. In this embodiment, the passive components 330 are each adhered to the noncircuit surface 310b of the first semiconductor chip 310 by means of a second adhesive layer 353 and electrically coupled to the substrate 300 through the use of wire-bonding technology by means of a second set of bonding wires 362.

Since the passive components 330 are mounted on a remaining surface area of the first semiconductor chip 310 that is unoccupied by the second semiconductor chip 320, rather than over the substrate 300, it allows-the overall package construction to be made more compact in size than prior art.

Figure 4:
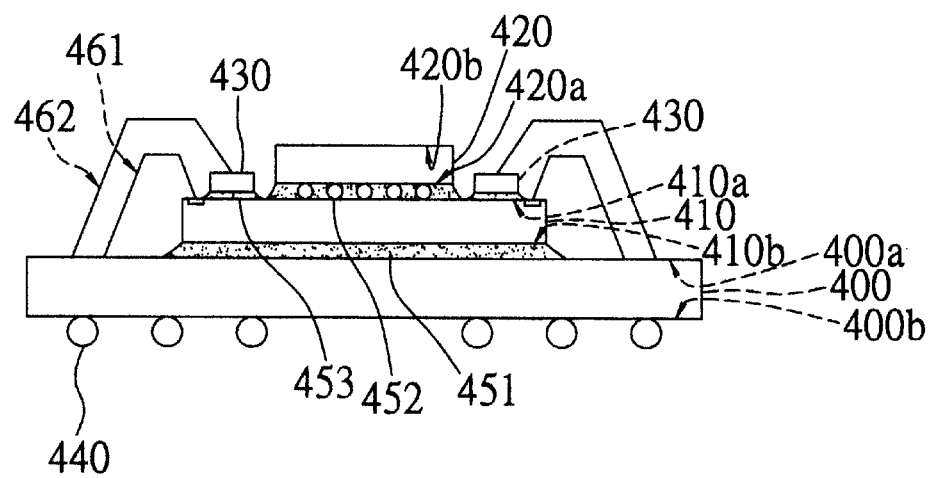
FIG. 4 shows a schematic sectional view of a fourth preferred embodiment of the stacked multi-chip package structure of the invention.

Fourth Preferred Embodiment (FIG. 4)

The fourth preferred embodiment of the stacked multi-chip package structure of the invention is disclosed in full details in the following with reference to FIG. 4.

As shown, the stacked multi-chip package structure of this embodiment comprises a substrate 400, a first semiconductor chip 410, a second semiconductor chip 420, and two passive components 430.

The substrate 400 has a front side 400a and a back side 400b, wherein the front side 400a is used for chip mounting, and the back side 400b is used for the mounting of a grid array of solder balls 440.

The first semiconductor chip 410 has a circuit surface 410a and a noncircuit surface 410b, wherein the noncircuit surface 410b is attached to the front side 400a of the substrate 400 by means of a first adhesive layer 451, such as silver paste. Further, the first semiconductor chip 410 is electrically coupled to the substrate 400 by means of a first set of bonding wires 461.

The second semiconductor chip 420 is smaller in size than the first semiconductor chip 410, and has a circuit surface 420a and a noncircuit surface 420b, wherein the circuit surface 420a is coupled to the circuit surface 410a of the first semiconductor chip 410 through the use of flip-chip technology by means of an array of solder bumps 452.

It is a characteristic feature of the invention that the passive components 430 are mounted on a remaining surface area of the first semiconductor chip 410 that is unoccupied by the second semiconductor chip 420. In this embodiment, the passive components 430 are each mounted on the circuit surface 410a of the first semiconductor chip 410 by means of a second adhesive layer 453 and electrically coupled to the substrate 400 through the use of wire-bonding technology by means of a second set of bonding wires 462.

Since the passive components 430 are mounted on a remaining surface area of the first semiconductor chip 410 that is unoccupied by the second semiconductor chip 420, rather than over the substrate 400, it allows the overall package construction to be made more compact in size than prior art.

CONCLUSION

In conclusion, the invention provides a stacked multi-chip package structure with on-chip integration of passive component, which is characterized in the mounting of passive component on a remaining surface area of the underlying semiconductor chip that is unoccupied by the overlying semiconductor chip, rather than over the substrate, so that the overall package construction can be made more compact in size than prior art. Moreover, since the passive components being integrated in the stacked multi-chip package are off-the-shelf components rather than being integrated in the substrate, the overall packaging process can be implemented more cost-effectively than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A stacked multi-chip package structure, which comprises:

(a) a substrate; and (b) a multi-chip module including at least a first semiconductor chip and a second semiconductor chip directly stacked on the first semiconductor chip, the second semiconductor chip being smaller in size than the first semiconductor chip, wherein the first semiconductor chip has a circuit surface and a non-circuit surface opposed to the circuit surface, and the circuit surface is defined with a chip-attach area for accommodating the second semiconductor chip and a component-attach area for allowing at least a passive component to be directly mounted thereon, and wherein the multi-chip module is mounted over the substrate in a manner that the non-circuit surface of the first semiconductor chip is attached to the substrate, and the circuit surface of the first semiconductor chip is electrically coupled to the substrate by means of bonding wire.

2. The stacked multi-chip package structure of claim 1, wherein the second semiconductor chip is mounted over the first semiconductor chip by means of an adhesive layer and electrically coupled to the substrate by means of bonding wires.

3. The stacked multi-chip package structure of claim 1, wherein the second semiconductor chip is mounted over the first semiconductor chip through the use of flip-chip technology.

4. The stacked multi-chip package structure of claim 1, wherein the passive component is electrically coupled to the substrate through the use of wife-bonding technology.

5. The stacked multi-chip package structure of claim 1, wherein the passive component is electrically coupled to the first semiconductor chip through the use of surface-mount technology.

6. A stacked multi-chip package structure, which comprises:

(a) a substrate; and (b) a multi-chip module including at least a first semiconductor chip and a second semiconductor chip directly stacked on the first semiconductor chip, the second semiconductor chip being smaller in size than the first semiconductor chip, wherein the first semiconductor chip has a circuit surface and a non-circuit surface opposed to the circuit surface, and the non-circuit surface is defined with a chip-attach area for accommodating the second semiconductor chip and a component-attach area for allowing at least a passive component to be directly mounted thereon, and wherein the multi-chip module is mounted over the substrate by attaching the circuit surface of the first semiconductor chip to the substrate through the use of flip-chip technology.

7. The stacked multi-chip package structure of claims 6, wherein the second semiconductor chip is mounted over the first semiconductor chip by means of an adhesive layer and electrically coupled to the substrate by means of bonding wires.

8. The stacked multi-chip package structure of claims 6, wherein the passive component is electrically coupled to the substrate through the use of wire-bonding technology.

* * * * *